United States Patent
Kim et al.

(10) Patent No.: US 8,125,076 B2
(45) Date of Patent: Feb. 28, 2012

(54) SEMICONDUCTOR PACKAGE SYSTEM WITH SUBSTRATE HEAT SINK

(75) Inventors: Gwang Kim, Kyoungki-do (KR); Koo Hong Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 614 days.

(21) Appl. No.: 11/164,132

(22) Filed: Nov. 10, 2005

(65) Prior Publication Data

US 2006/0103010 A1    May 18, 2006

Related U.S. Application Data

(60) Provisional application No. 60/627,645, filed on Nov. 12, 2004.

(51) Int. Cl.
*H01L 23/34* (2006.01)
*H01L 23/10* (2006.01)

(52) U.S. Cl. ........... 257/707; 257/E23.101; 257/704; 257/706; 438/125

(58) Field of Classification Search .......... 257/680, 257/678, 737, 738, 734, 686, E23.092, 706, 257/707, 720, E23.101, E25.023, 704, 712, 257/713; 438/122, 125
See application file for complete search history.

(56) References Cited

U.S. PATENT DOCUMENTS

| 5,541,450 | A | * | 7/1996 | Jones et al. | 257/697 |
| 5,561,323 | A | | 10/1996 | Andros et al. | 257/707 |
| 5,583,377 | A | | 12/1996 | Higgins, III | 257/707 |
| 5,696,666 | A | * | 12/1997 | Miles et al. | 361/764 |
| 5,972,736 | A | * | 10/1999 | Malladi et al. | 438/118 |
| 5,990,545 | A | | 11/1999 | Schueller et al. | 257/697 |
| 6,011,694 | A | | 1/2000 | Hirakawa | 361/774 |
| 6,127,726 | A | * | 10/2000 | Bright et al. | 257/691 |
| 6,215,175 | B1 | | 4/2001 | Kinsman | 257/666 |
| 6,515,356 | B1 | * | 2/2003 | Shin et al. | 257/678 |
| 6,664,617 | B2 | | 12/2003 | Siu | 257/669 |
| 6,781,242 | B1 | * | 8/2004 | Fan et al. | 257/777 |
| 6,798,063 | B2 | * | 9/2004 | Kinsman | 257/737 |
| 6,828,687 | B2 | * | 12/2004 | Ding | 257/778 |
| 6,853,070 | B2 | | 2/2005 | Khan et al. | 257/707 |
| 6,861,747 | B2 | * | 3/2005 | Miyazaki et al. | 257/718 |
| 6,867,066 | B2 | | 3/2005 | Yamaguchi | 438/107 |
| 6,894,384 | B1 | * | 5/2005 | Shizuno | 257/712 |
| 7,008,820 | B2 | * | 3/2006 | Shim et al. | 438/108 |
| 7,037,750 | B2 | * | 5/2006 | Tsai et al. | 438/106 |
| 7,105,919 | B2 | * | 9/2006 | Kim | 257/700 |
| 2002/0074636 | A1 | | 6/2002 | Siu | 257/678 |
| 2003/0164543 | A1 | * | 9/2003 | Kheng Lee | 257/706 |

* cited by examiner

*Primary Examiner* — Chris Chu
(74) *Attorney, Agent, or Firm* — Mikio Ishimaru

(57) ABSTRACT

A semiconductor package system is provided including: providing a substrate having substrate wiring and a cavity provided therein with a heat sink foil closing off the cavity; attaching a semiconductor die in the cavity to the heat sink foil; and bonding the semiconductor die to the substrate wiring.

20 Claims, 3 Drawing Sheets

SEMICONDUCTOR PACKAGE SYSTEM WITH SUBSTRATE HEAT SINK

CROSS-REFERENCE TO RELATED APPLICATION(S)

This application claims the benefit of U.S. Provisional Patent Application Ser. No. 60/627,645 filed Nov. 12, 2004 and the subject matter thereof is hereby incorporated herein by reference thereto.

TECHNICAL FIELD

The present invention relates generally to semiconductor package system, and more particularly to semiconductor package systems with heat sinks.

BACKGROUND ART

In the electronics industry, a continuing objective is to further and further reduce the size of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. The IC chips are usually made from a semiconductor material such as silicon or gallium arsenide. Photolithographic techniques are used to form the various semiconductor devices in multiple layers on the IC chips.

Heat management through such a structure can be critical. The internal thermal resistance and thermal performance of the flip chip interconnect technology are determined by a series of heat flow paths. By making high heat conductivity connections between the bottom of the die and the substrate, heat generated in the die can be transferred efficiently from the die to the substrate.

For applications where additional heat must be removed from the semiconductor die, the molding compound that encapsulates the die can be partially omitted from the upper surface of the die to partially expose this surface. The exposed die surface can then be put in direct physical contact with a heat spreader that overlies the semiconductor die. To enhance the cooling performance, a layer of thermal grease or the like can be spread between the die surface and the heat spreader to improve heat transfer to the heat spreader.

The heat spreader is typically formed so that it can also be attached to the underlying substrate, resulting in a mechanically strong package. Where necessary, the heat spreader can also be encapsulated in a molding compound that is formed overlying the upper surface of the package.

The heat thus flows first from the semiconductor device to the body of the semiconductor module or package into which it has been incorporated, and then to the package surface and to the heat spreader that is attached to the package surface. Unfortunately, there are drawbacks associated with the use of known heat spreaders and other semiconductor packages. Among these drawbacks are heat spreader manufacturing costs, complicated assembly processes, and concerns about package reliability.

Modern electronic systems demand continued decreases in size. The volumetric size of systems is dependent not only on the area of the semiconductor package, but also on the thickness of the semiconductor package. Using thin semiconductor packages allows smaller electronic systems to be built. Current trends place a premium on semiconductor packages that can incorporate multiple semiconductor dies in stacks or stacks of packages.

One proposed solution involves providing a heat sink or metal slug attached to the semiconductor package to help remove the heat. Unfortunately, this additional heat sink or metal slug adds to the package thickness, and prevents stacking of multiple packages.

Another proposed solution involves mounting the semiconductor die within an interior metal housing having sidewalls and flanges for retention. Unfortunately, this creates the need to use longer bond wires. Additionally, added vertical stress is created by the metal sidewalls of the housing.

Thus, a need still remains for thin packages with high thermal dissipation and it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system including: providing a substrate having substrate wiring and a cavity provided therein with a heat sink foil closing off the cavity; attaching a semiconductor die in the cavity to the heat sink foil; and bonding the semiconductor die to the substrate wiring.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
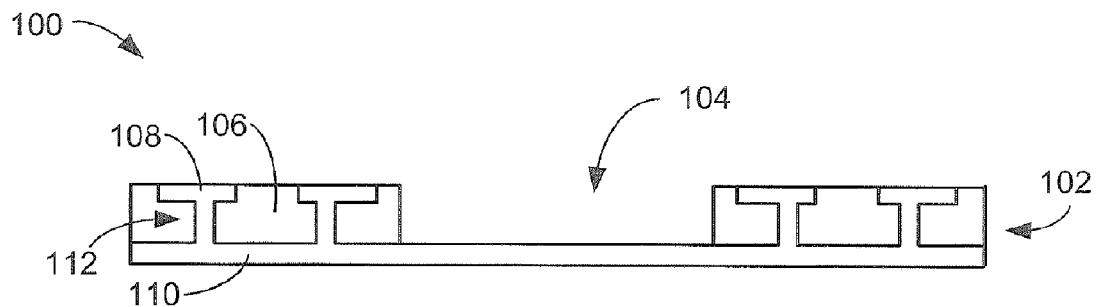
FIG. 1 is a cross sectional view of a semiconductor package system in an initial stage of manufacture in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known process steps are not disclosed in detail.

Additionally, the drawings showing embodiments of the semiconductor package system are semi-diagrammatic and not to scale and, particularly, some of the dimensions are for the clarity of presentation and are shown exaggerated in the drawing FIGs.

The same number is used to designate similar parts as a matter of convenience and for ease of understanding the present invention.

The term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is contact among different elements.

Referring now to FIG. 1, therein is shown a cross sectional view of a semiconductor package system 100 in an initial stage of manufacture in accordance with an embodiment of the present invention. The semiconductor package system 100 is a single system and includes a substrate 102 having a cavity 104. The cavity 104 is a through cavity and can be of any shape and in any location in the substrate 102. The substrate 102 includes a substrate core or prepreg material 106 with integral top and bottom foils 108 and 110 connected by vias 112. The bottom foil 110 closes off the bottom of the cavity 104.

The substrate 102 can be part of a long substrate strip 102 upon which a large number of semiconductor package systems 100 can be formed and later singulated but for purposes of simplicity only one semiconductor package system 100 is shown being formed.

By controlling the thickness or thinness of the substrate 102, the thickness or thinness semiconductor package system 100 can be affected directly.

Figure 2:
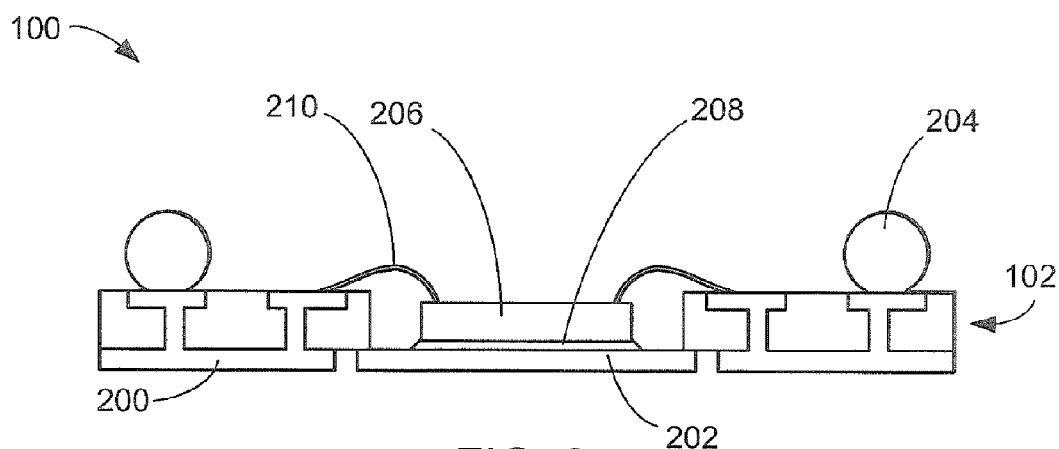
FIG. 2 is a cross sectional view of the structure of FIG. 1 in a die attach stage.

Referring now to FIG. 2, a cross sectional view of the structure of FIG. 1 in a die attach stage. The top and bottom foils 108 and 110 are processed to form substrate wiring 200 and a conductive foil referred to as a heat sink foil 202. The bottom foil 110 is along a first side of the substrate 102 and is physically isolated from the heat sink foil 202. The top foil 108, which has a top foil first portion and a top foil second portion, is on a second side of the substrate 102. The top foil first portion and the top foil second portion of the top foil 108 are physically isolated on the second side of the substrate 102 by the substrate 102. The vias 112 of FIG. 1 connect both the top foil first portion and the top foil second portion of the top foil 108 to a single portion of the bottom foil 110 that is isolated from the heat sink foil 202.

Solder balls 204 are deposited on the top foil second portion of the top foil of the substrate wiring 200 and a semiconductor die 206 is bonded on the heat sink foil 202 by a die attach adhesive 208. The semiconductor die 206 is then wire bonded to the top foil first portion of the top foil of the substrate wiring 200 by bond wires 210 on a side of the substrate 102 of FIG. 1 opposite the heat sink foil 202. The semiconductor die 206 is electrically in contact with the solder balls 204. The substrate wiring 200 includes the top and bottom foils 108 and 110 of FIG. 1 separated by a portion of the prepreg material 106 of FIG. 1. A portion of the bottom foil 110, formed as a single layer, forms the heat sink foil 202, thereby formed as a single layer. The heat sink foil 202 is electrically isolated from the substrate wiring 200 including the top foil 108 and the vias 112.

Optionally, the semiconductor die 206 can be attached to the heat sink foil 202 by the die attach adhesive 208, which can be a solder or thermal grease, for better heat transfer than through an epoxy die attach adhesive.

Figure 3:
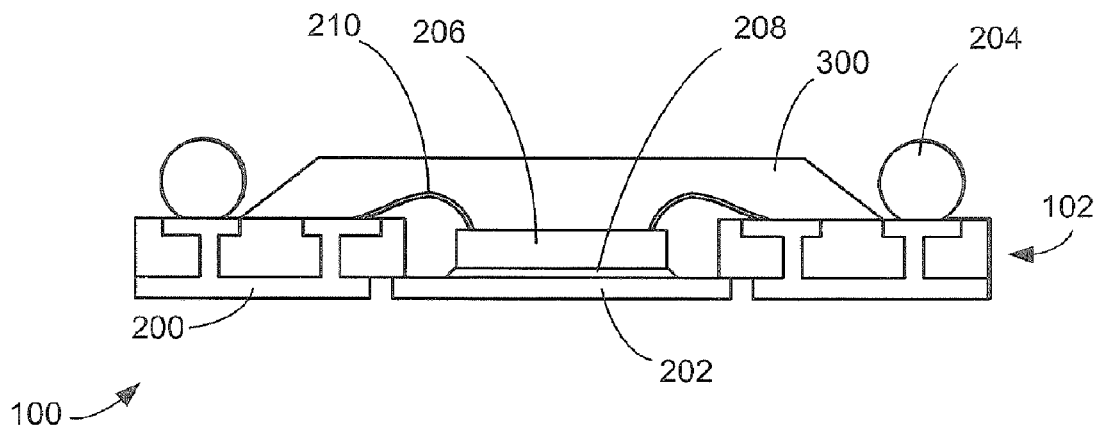
FIG. 3 is a cross sectional view of the structure of FIG. 2 in an encapsulation stage.

Referring now to FIG. 3, therein is shown a cross sectional view of the structure of FIG. 2 in an encapsulation stage. An encapsulant 300 is molded over the heat sink foil 202, the die attach adhesive 208, the semiconductor die 206, and around the bond wires 210.

The heat sink foil 202 on the bottom is not covered by the encapsulant 300 so it provides a superior convention heat sink.

By controlling the thickness or thinness of the solder balls 204 and the encapsulant 300, the thickness or thinness semiconductor package system 100 can be affected directly.

Figure 4:
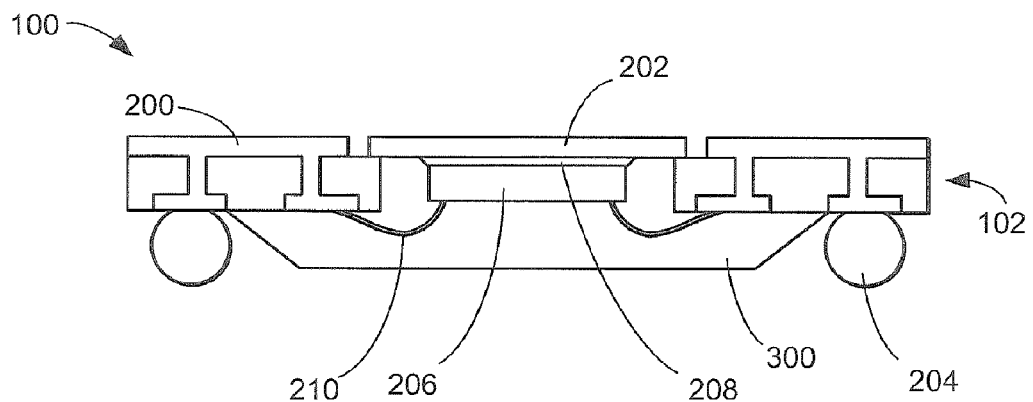
FIG. 4 is a cross sectional view of the structure of FIG. 3 in a flipped stage.

Referring now to FIG. 4, therein is shown a cross sectional view of the structure of FIG. 3 in a flipped stage. The solder balls 204 extend further below the substrate 102 than the encapsulant 300.

Figure 5:
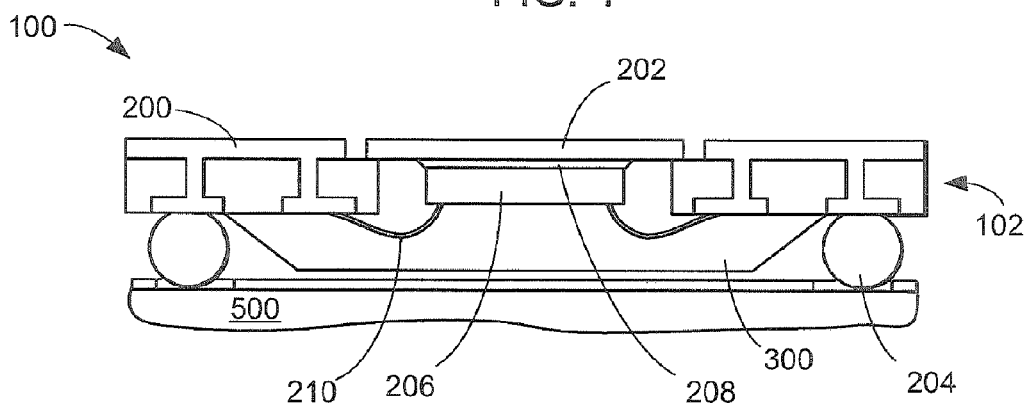
FIG. 5 is a cross sectional view of the structure of FIG. 4 in a board attach stage.

Referring now to FIG. 5, therein is shown a cross sectional view of the structure of FIG. 4 in a board attach stage. Since the solder balls 204 extend further below the substrate 102 than the encapsulant 300, the solder balls 204 support the semiconductor package system 100 above a printed circuit board 500.

The heat sink foil 202 is exposed for direct heat transfer to the air above the die 206. Where the semiconductor die 206 is a conductive die attach adhesive 208, the heat sink foil 202 can also be electrically connected to the printed circuit board 500 so the semiconductor die 206 can be biased by connection to a ground or a power source to provide a shield against exterior noise sources or to provide a conductive drain connection for carrier or hole leakage from the semiconductor die 206 to the printed circuit board 500.

It has been discovered that a thinner semiconductor package system can be created using a single substrate with a heat sink foil. This is an improvement upon other systems that use separate heat sink elements.

Figure 6:
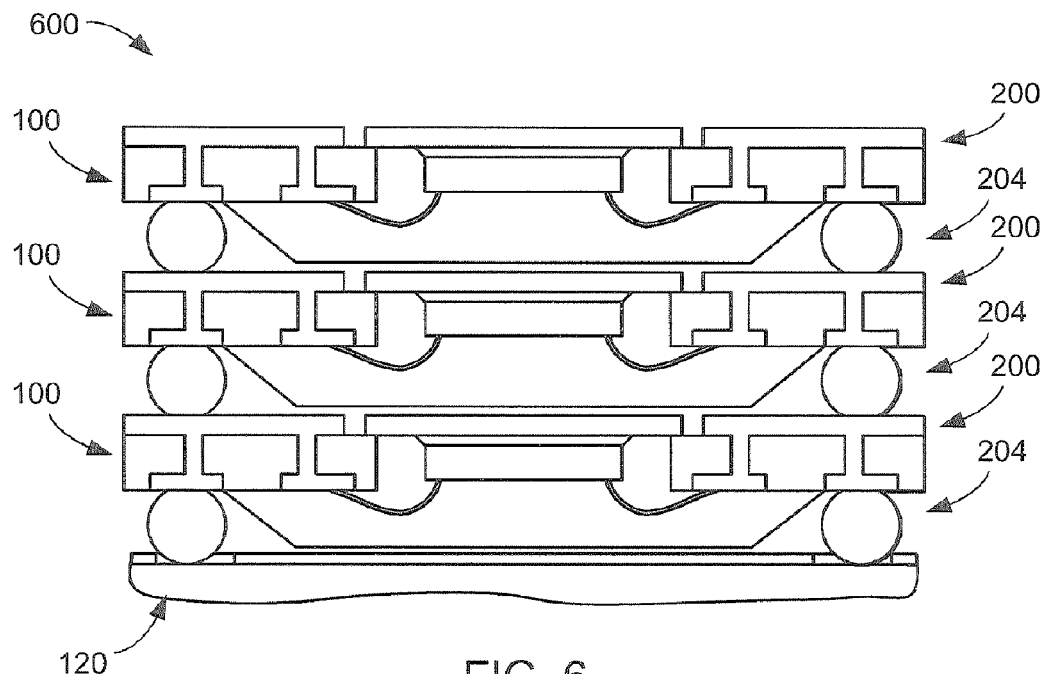
FIG. 6 is a cross sectional view of a semiconductor package system in accordance with another embodiment of the present invention.

Referring now to FIG. 6, therein is shown a cross sectional view of a semiconductor package system 600 in accordance with another embodiment of the present invention. The semiconductor package system 600 is a multiple-system system in which a number of semiconductor package systems 100 (three are shown by way of example) are stacked with the solder balls 204 of one semiconductor package system electrically connected with the substrate wiring 200 of the semiconductor package system below it. The semiconductor package systems 100 are in turn stacked with the solder balls 204 of one semiconductor package system electrically connected with a printed circuit board 120.

Since the solder balls 204 extend further below the substrate 102 than the encapsulant 300, the heat sink foil 202 of each semiconductor package system 100 is exposed to permit heat transfer to the air.

In another option where a more rigid stack is desired, the entire semiconductor package system 600 can be encapsulated.

Figure 7:
FIG. 7 is a flow chart of a semiconductor package system for manufacturing a semiconductor package system in accordance with a further embodiment of the present invention.

Referring now to FIG. 7, therein is shown a flow chart of a semiconductor package system 700 for manufacturing the semiconductor package system 100 in accordance with a further embodiment of the present invention. The system 700 includes: providing a substrate having substrate wiring and a cavity provided therein with a heat sink, made with the substrate wiring, closing off the cavity on a first side of the substrate in a block 702; attaching a semiconductor die in the cavity to the heat sink, the semiconductor die connected to the substrate wiring on a second side of the substrate by wire bonds in a block 704; and depositing solder balls on the substrate wiring on the second side of the substrate adjacent the wire bonds in a block 706.

It has been discovered that the present invention thus has numerous aspects. An aspect is that the present invention has reduced semiconductor package system height. Another aspect is improved thermal performance. Yet another aspect of the present invention is that it valuably supports and services the historical trend of reducing costs, simplifying systems, and increasing performance.

These and other valuable aspects of the present invention consequently further the state-of-the-technology to at least the next level.

Thus, it has been discovered that the semiconductor package system of the present invention furnishes important and heretofore unknown and unavailable solutions, capabilities, and functional aspects for the semiconductor package system.

The resulting processes and configurations are straightforward, cost-effective, uncomplicated, highly versatile and effective, can be implemented by adapting known technologies, and are thus readily suited for efficiently and economically manufacturing semiconductor package systems.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of a semiconductor package system comprising:
   providing a substrate having substrate wiring, formed from a top foil and a bottom foil, and a cavity provided therein with a heat sink formed from the bottom foil closing off the cavity on a first side of the substrate with the bottom of the heat sink exposed;
   attaching a semiconductor die in the cavity on the heat sink, the semiconductor die connected to a top foil first portion by wire bonds; and
   depositing solder balls on a top foil second portion, isolated on the second side of the substrate from the top foil first portion, the top foil first portion and the top foil second portion both connected to a portion of the bottom foil isolated from the heat sink with the top foil first portion connected to the wire bonds.

2. The method as claimed in claim 1 wherein attaching the semiconductor die includes conductively connecting the semiconductor die to the heat sink.

3. The method as claimed in claim 1 wherein providing the substrate includes providing the substrate from a substrate strip for manufacturing a plurality of semiconductor package systems.

4. The method as claimed in claim 1 further comprising conductively connecting the semiconductor die to the heat sink and to a printed circuit board.

5. The method as claimed in claim 1 further comprising:
   mounting the substrate on a printed circuit board, the substrate having first substrate wiring; and
   stacking a second substrate on the substrate, the second substrate having solder balls for conductive connection to the first substrate wiring.

6. A method of manufacture of a semiconductor package system comprising:
   providing a substrate having substrate wiring, formed from a top foil and a bottom foil, and a cavity provided therein and a heat sink foil formed from the bottom foil closing off the cavity on a first side of the substrate;
   attaching solder balls to a top foil second portion, isolated on a second side of the substrate from a top foil first portion, the top foil first portion and the top foil second portion both connected to a portion of the bottom foil isolated from the heat sink with the top foil first portion connected to wire bonds;
   attaching a semiconductor die in the cavity on the heat sink foil;
   wire bonding the semiconductor die to the substrate wiring with the bond wires on the second side of the substrate and adjacent to the solder balls; and
   encapsulating the semiconductor die in the cavity and over the bond wires on the second side of the substrate with the bottom of the heat sink foil exposed.

7. The method as claimed in 6 wherein attaching the semiconductor die uses a conductive die attach adhesive to conductively connect the semiconductor die to the heat sink foil.

8. The method as claimed in 6 wherein:
   providing the substrate includes providing the substrate from a substrate strip;
   attaching a semiconductor die includes attaching a plurality of semiconductor die to the substrate strip; and
   singulating the substrate strip into a plurality of substrates.

9. The method as claimed in 6 further comprising:
   mounting the substrate on a printed circuit board using the solder balls; and
   conductively connecting the semiconductor die and heat sink foil to the printed circuit board.

10. The method as claimed in 6 wherein:
    encapsulating the semiconductor die forms a first semiconductor package system;
    mounting the first semiconductor package system on a printed circuit board, the first semiconductor package system having first substrate wiring; and
    stacking a second semiconductor package system on the first semiconductor package system, the second semiconductor package system having solder balls conductively connected to the first substrate wiring.

11. A semiconductor package system comprising:
    a substrate having substrate wiring, formed from a top foil and a bottom foil, and a cavity provided therein with a heat sink formed from the bottom foil closing off the cavity on a first side of the substrate with the bottom of the heat sink exposed;
    a semiconductor die in the cavity attached on the heat sink and connected to a top foil first portion by bond wires; and
    solder balls on the substrate wiring on a top foil second portion, isolated on the second side of the substrate from the top foil first portion, the top foil first portion and the top foil second portion both connected to a portion of the bottom foil isolated from the heat sink with the top foil first portion connected to the wire bonds.

12. The system as claimed in claim 11 further comprising a conductive connection for connecting the semiconductor die to the heat sink.

13. The system as claimed in claim 11 wherein the substrate is part of a substrate strip for manufacturing a plurality of semiconductor package systems.

14. The system as claimed in claim 11 further comprising:
a printed circuit board; and
a conductive connection for connecting the semiconductor die to the heat sink and to the printed circuit board.

15. The system as claimed in claim 11 further comprising:
the substrate mounted on a printed circuit board, the substrate having first substrate wiring; and
a second substrate stacked on the substrate, the second substrate having solder balls for conductive connection to the first substrate wiring.

16. The system as claimed in claim 11 further comprising:
an encapsulant around the semiconductor die in the cavity and over the bond wires on the second side of the substrate; and
the heat sink made of a heat sink foil with the bottom of the heat sink foil exposed by the encapsulant.

17. The system as claimed in claim 16 further comprising a conductive die attach adhesive to conductively connect the semiconductor die to the heat sink foil.

18. The system as claimed in claim 16 wherein:
the substrate is part of a substrate strip; and
a plurality of semiconductor die is mounted to the substrate strip.

19. The system as claimed in claim 16 further comprising:
a printed circuit board;
the substrate mounted on the printed circuit board by the solder balls; and
the semiconductor die and the heat sink foil are conductively connected to the printed circuit board.

20. The system as claimed in claim 16 further comprising:
a printed circuit board;
the semiconductor die is included in a first semiconductor package system;
the first semiconductor package system is mounted on the printed circuit board, the first semiconductor package system having first substrate wiring; and
a second semiconductor package system stacked on the first semiconductor package system, the second semiconductor package system having solder balls conductively connected to the first substrate wiring.

* * * * *